United States Patent
Marrah et al.

(10) Patent No.: US 6,728,522 B1
(45) Date of Patent: *Apr. 27, 2004

(54) WEATHER BAND RADIO AND METHOD OF TUNING SAME

(75) Inventors: Jeffrey Joseph Marrah, Kokomo, IN (US); Harry Diamond, Tipton, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 09/390,986

(22) Filed: Sep. 7, 1999

(51) Int. Cl.[7] ................................................. H04B 1/18
(52) U.S. Cl. .............................. 455/179.1; 455/150.1; 455/152.1; 455/183.2; 455/185.1; 455/188.1
(58) Field of Search ........................... 455/175.1, 178.1, 455/179.1, 183.2, 184.1, 185.1, 186.2, 188.1, 150.1, 151.1, 151.2, 152.1, 154.1, 161.1, 161.3, 164.2, 166.2, 404.1, 404.2, 414.3, 418, 422.1

(56) References Cited

U.S. PATENT DOCUMENTS

| | | | |
|---|---|---|---|
| 4,031,467 A | 6/1977 | Singleton, Jr. et al. | 325/54 |
| 4,888,815 A * | 12/1989 | Ahlemeyer et al. | 455/194 |
| 4,947,456 A * | 8/1990 | Atkinson et al. | 455/165 |
| 5,355,526 A * | 10/1994 | Berninger | 455/161.2 |
| 5,390,237 A | 2/1995 | Hoffman, Jr. et al. | 379/67 |
| 5,393,713 A * | 2/1995 | Schwob | 455/186.1 |
| 5,420,794 A | 5/1995 | James | 364/436 |
| 5,457,816 A * | 10/1995 | Koyama | 455/161.2 |
| 5,574,999 A | 11/1996 | Gropper | 455/186.1 |
| 5,724,316 A * | 3/1998 | Brunts | 368/10 |
| 5,781,852 A | 7/1998 | Gropper | 455/227 |
| 6,282,412 B1 * | 8/2001 | Lyons | 455/186.1 |

OTHER PUBLICATIONS

National Weather Service, NOAA Weather Radio (NWR) Transmitters, NWR Specific Area Message Encoding NWR Same, Update #4.42, Mar. 31, 1999.

* cited by examiner

Primary Examiner—William Trost
Assistant Examiner—Meless Zewdu
(74) Attorney, Agent, or Firm—Stefan V. Chmielewski

(57) ABSTRACT

A mobile weather band radio and method of tuning the radio to select a signal channel based on geographic position. The radio has a weather band tuner adjustable for a plurality of radio wave signal channels. A position indicative receiver is provided for receiving position indicative signals and determining a current position of the radio. A controller automatically tunes the tuner to a select signal channel based on the determined geographic region.

28 Claims, 4 Drawing Sheets

WEATHER BAND RADIO AND METHOD OF TUNING SAME

TECHNICAL FIELD

The present invention generally relates to electronic radios and, more particularly, to a mobile tuneable weather band radio for providing broadcast weather messages, emergency messages, and other information.

BACKGROUND OF THE INVENTION

The National Oceanic and Atmospheric Administration (NOAA) has been providing a weather band radio broadcast service in the United States for many years. The NOAA weather radio (NWR) service provides continuous weather and emergency related updates to local geographic regions. The NOAA weather radio service provides weather-related warnings and serves as a broadcast warning system for other emergency messages about events that may threaten life and/or property. To receive weather band broadcast service information, a specially designed receiver is generally required to tune to the weather band broadcast. Currently, the NOAA weather band broadcast transmissions include seven narrow band frequency modulated (FM) channels in the very high frequency (VHF) band ranging from 162.400 to 162.550 kHz, with a 25 kHz channel separation between adjacent channels. The seven channels are broadcast from transmitters located in various geographic regions and the signals for multiple channels often overlap. Accordingly, it is possible to tune a weather band radio to receive a plurality of weather band channels from one location.

Recently, NOAA has added digital voice synthesis which allows for faster distribution of emergency updates, in contrast to analog voice recordings. Moreover, NOAA has also added Specific Area Message Encoding (SAME) which provides digital information indicative of the geographic region covered by the accompanying message. Currently, the geographic regions are typically defined by counties. This allows for weather band receivers to filter out messages that do not pertain to a selected geographic region. In general, the NOAA weather radio transmitter devoted to a given geographic area may not provide the strongest signal with the best reception that is available at certain locations in its coverage area. As a consequence, by simply tuning to the station having the strongest signal, a radio user may miss those messages pertaining to the geographic region of interest.

The use of the SAME message generally allows for receipt of only those messages in a selected geographic area. The weather band radio must include decoding circuitry capable of decoding the SAME digital message. In addition, a geographic identification code generally is used to identify the county of interest, and the code must be manually input into the decoding circuitry to configure the radio for the geographic area of interest. Once configured, the weather band radio will respond only to those messages associated with the selected geographic identification code, and may ignore alert messages which do not pertain to the selected region of interest. For home-based weather band radios, the SAME message is satisfactory since the location of the radio is generally fixed. However, when the weather band radio is transported from one geographic coverage region to another geographic coverage region, the weather band radio generally must be reprogrammed by the user. This reprogramming drawback becomes particularly significant when a weather band radio is used in a mobile vehicle, such as an automobile, which frequently travels amongst various geographic counties. Accordingly, it is therefore desirable to provide for a weather band radio which offers dynamic updating to adjust for geographic location.

SUMMARY OF THE INVENTION

In accordance with the teachings of the present invention, a tuneable radio and method are provided for automatically selecting a radio wave signal channel based on location. The radio has a receiver for receiving broadcast radio wave signals and a tuner adjustable for selecting from a plurality of radio wave signal channels. The radio has a device for determining a current position of the radio. The radio also has a controller for controlling the tuner to select a radio wave signal channel based on the determined current position of the radio.

Accordingly, the radio is automatically tuned to receive a broadcast channel that is dedicated to the geographic region in which the radio is located. This radio advantageously ignores those radio wave signal channels that are not dedicated to the geographic region of interest. The radio is particularly well suited for, but not limited to, use as a weather band radio for use in a mobile application.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DETAILED DESCRIPTION OF THE PREFERRED EMBODIMENTS

Figure 1:
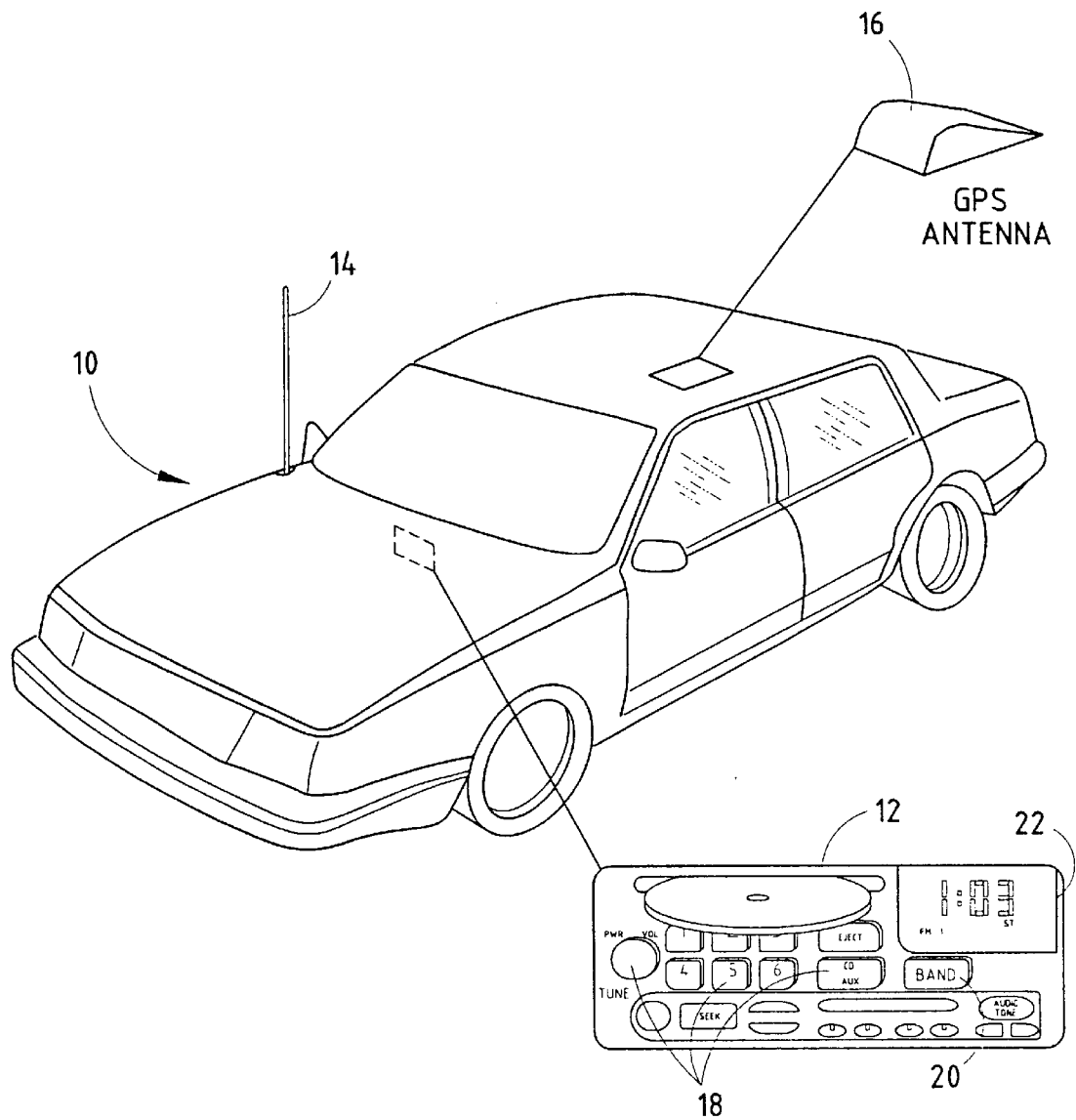
FIG. 1 is a perspective view of an automotive vehicle equipped with a weather band radio.

Referring to FIG. 1, an automotive vehicle 10 is shown equipped with an AM/FM audio car radio 12 which includes a weather band radio integrated with the audio car radio 12. According to the preferred embodiment, the weather band radio is integrated into the automotive vehicle's AM/FM audio car radio 12 to provide for receipt of weather band signals that are broadcast within a geographic region of interest. While the weather band radio described herein is integrated into an audio car radio 12, it should be appreciated that the weather band radio may be employed as a separate stand alone electronic device, such as a portable hand held device, and may be used in other various applications, without departing from the teachings of the present invention.

The audio car radio 12 may be easily mounted in the dash of the vehicle 10 according to a conventional car radio installation. The car radio 12 shown is an AM/FM radio equipped with an audio tape and a CD player, and includes a human-machine interface (HMI) key matrix with a plurality of manually operable controls 18 which extend from its face plate. Included in the controls 18 is a "BAND" pushbutton switch 20 for selecting amongst the available broadcast bands which include the amplitude modulation (AM) band, the frequency modulation (FM) band, and the weather band. The controls 18 and display 22 are easily accessible by the driver or a passenger in the vehicle 10. In addition, the vehicle 10 further includes an AM/FM/weather band antenna 14 for receiving broadcast signals. Antenna 14 is capable of receiving the weather band frequency range, as well as the AM and/or FM broadcast signals. Further, a global positioning system (GPS) antenna 16 is preferably mounted on the roof of the vehicle 10, and is exposed to GPS radio wave signals.

Figure 2:
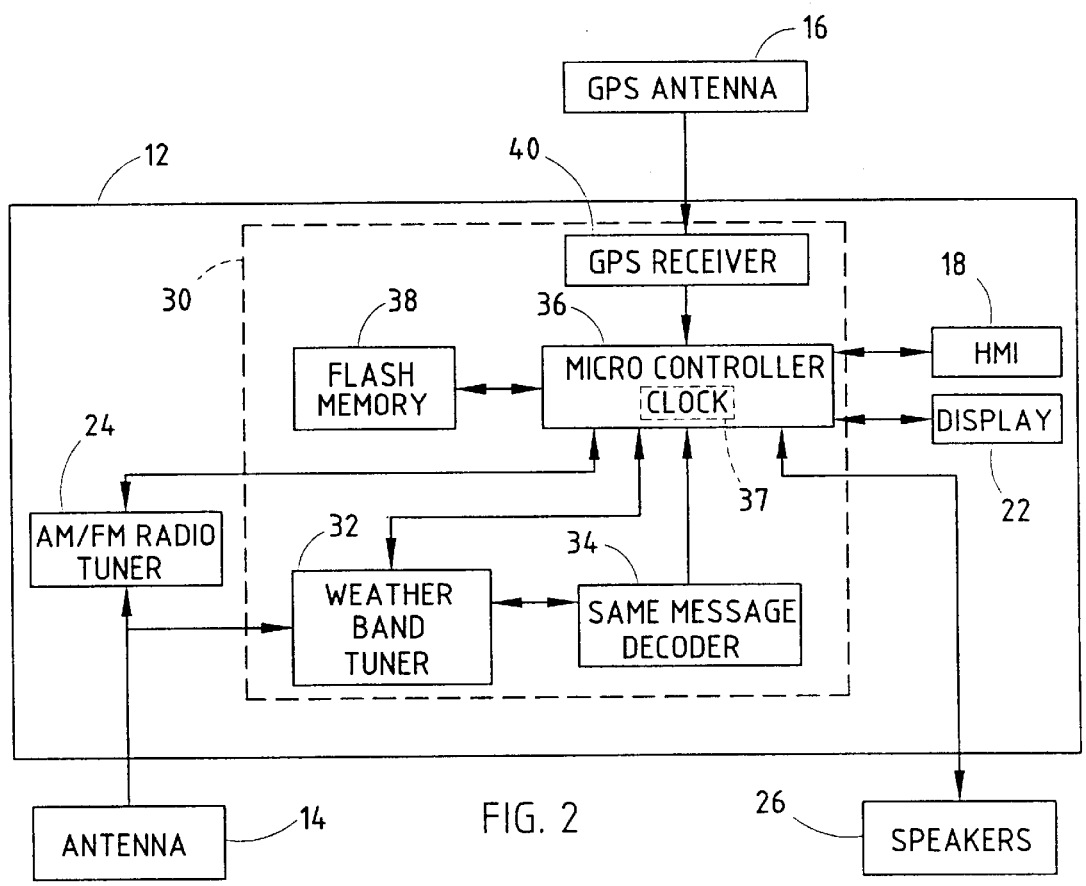
FIG. 2 is a block diagram of the weather band radio integrated into the car radio according to the present invention.

Referring to FIG. 2, the audio car radio 12 is shown connected to antennas 14 and 16, and is further connected to audio speakers 26. Audio car radio 12 contains a conventional AM/FM radio tuner 24 coupled to antenna 14 for tuning to selected radio frequencies. Integrated within the audio radio 12 is a weather band radio 30 which is generally shown by dash lines. The weather band radio 30 is commonly packaged and integrated with the audio car radio 12 such that certain electronics may be shared with the AM/FM radio electronics. The weather band radio 30, according to the present invention, may include a stand alone weather band radio, or may be integrated in the audio car radio 12 as shown.

Included in weather band radio 30 is a weather band tuner 32 which is coupled to antenna 14 for receiving signals received on antenna 14. Coupled to the tuner 32 is a SAME message decoder 34 which receives and decodes the Specific Area Message Encoding (SAME) weather band signals provided by weather band tuner 32. The weather band radio 30 also includes a microcontroller 36, preferably containing a microprocessor, and non-volatile memory, such as flash memory 38. The weather band radio has a time clock 37, shown integrated in the microcontroller 36, for tracking time of day. In addition, the weather band radio 30 further includes a global positioning system (GPS) receiver 40 which is coupled to the GPS antenna 16 for receiving current position indicating signals.

The weather band tuner 32 is automatically adjustable via the microcontroller 36 to tune to one of a plurality of available weather band channels for receiving broadcast weather band signals which may contain weather, emergency or other messages. Weather band tuners are commercially available and are well-known in the art for receiving broadcast narrow band FM signals provided throughout the United States by the National Oceanic and Atmospheric Administration (NOAA) weather radio (NWR) service. Currently, the NOAA weather radio service transmits seven weather band channels in the very high frequency range of 162.400 to 162.550 kHz, having a 25 kHz channel spacing between adjacent channels. The weather band tuner 32 is adjustable in that it can be adjusted to tune to any one of the channels that are made available.

The NOAA weather radio service currently transmits weather and emergency related message information on the weather band, and provides an emergency alert system in which weather and emergency messages are broadcast, along with other information, as part of the specific area message encoding (SAME) message. The SAME message further includes one or more geographic identifiers, generally in the form of alphanumeric codes, which define the geographical counties to which the weather or emergency information pertains. Currently, each geographic identification code corresponds to a unique county, however, other geographical boundaries may be defined and assigned a unique code. A description of the current specific area message encoding provided by the NOAA weather radio service is disclosed in the published report entitled "NATIONAL WEATHER SERVICE, NOAA WEATHER RADIO (NWR) TRANSMITTERS, NWR SPECIFIC AREA MESSAGE ENCODING," Update #4.42, dated Mar. 31, 1999, which is hereby incorporated by reference.

The SAME message decoder 34 receives and decodes the SAME message received by the weather band tuner 32, and provides the decoded message to the microcontroller 36. It should be appreciated that the SAME message decoding could, alternatively, be performed by the microcontroller 36. The microcontroller 36 processes the SAME message, along with GPS received position indication information and, in accordance with the programmed software stored in flash memory 38 or other memory, actuates the appropriate response for the geographical region of interest. According to one embodiment, the microcontroller 36 determines and selects the radio wave signal channel that is dedicated to the current geographic region of interest as determined by the GPS position coordinates. According to another embodiment, the microcontroller 36 scans the available radio wave signal channels with the weather band tuner 32 to determine which channel is dedicated to the region covering the GPS determined position.

According to well-known GPS operations, the GPS receiver 40 receives GPS radio wave signals via the GPS receiving antenna 16. The GPS radio wave signals are emitted from existing GPS satellites. A constellation of multiple high altitude GPS satellites currently exist in earth orbit and are available to provide continuous worldwide position fixes in all types of weather conditions. The GPS receiver 40 has a built-in processing unit and memory for processing the GPS radio wave signals to determine the latitude and longitude position coordinates of the current position, as well as determining the current direction of travel and speed of the vehicle.

More specifically, the GPS receiver 40 continuously receives radio wave signals from the GPS antenna 16 and determines accurate position coordinates which identify the location of the received signals. This determination includes calculating the distance from various satellites to determine a position relative thereto. By measuring the current signals sent by the GPS satellites and knowing orbital parameters of the satellites, the GPS receiver 40 is able to determine the position thereof and generate longitude and latitude position coordinates which identify the position of the received signals. Given the received GPS signals, the latitude and longitude position coordinates of the GPS receiver 40 are determined by computing distance from each of several GPS satellites currently visible to the receiver 40 by direct-line-of-sight. Distance is determined by precise computation of the time required for radio signals to travel from the GPS satellite to the GPS receiver. Combined with precise information about the satellites' positions relative to the earth, precise latitude and longitude position coordinates are computed. GPS is widely known and should be understood to those skilled in the art as a means for providing accurate position information. It should also be understood that enhanced accuracy may be obtained with GPS now and in the future. For example, a differential receiver can also be employed to provide the availability of differential GPS which provides enhanced position determining accuracy.

Further, it should be appreciated that other forms of position determining devices, other than GPS, could be employed now and in the future to provide updated position information.

Figure 3:
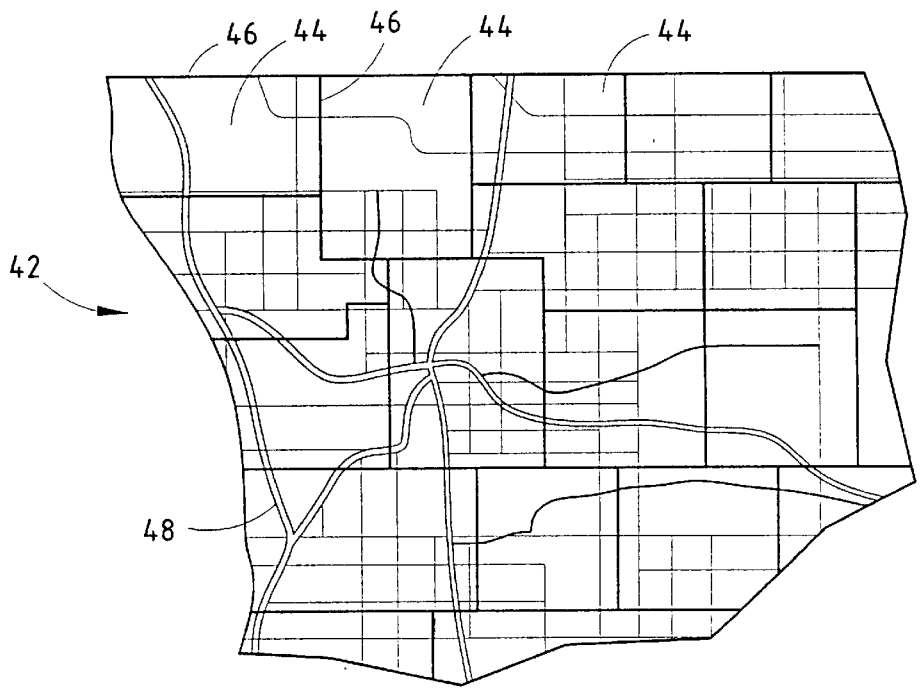
FIG. 3 is a map illustrating one example of geographic county regions which are electronically stored for use in the weather band radio.

Geographic regions are electronically mapped and stored in memory along with geographic identification codes that identify each of the regions. An example of a geographic territory and the boundaries defining each county as the geographic regions is shown in FIG. 3. The solid lines 46 represent the geographic boundaries defining each of a plurality of counties 44. As a mobile vehicle travels on a road 48, the vehicle may cross geographic boundaries 46 to travel from one county to another county. Each of the counties 44 has an assigned geographic identification code stored in memory. The longitude and latitude position coordinates of the boundaries may be stored in memory and compared to the GPS derived current position to determine which geographic region the radio 30 is currently located within.

The weather band radio 30 of the present invention determines which geographic county the vehicle is currently located in, and automatically tunes the radio 30 to a channel which pertains to that geographic county. According to one embodiment, the radio 30 compares the current GPS position to stored geographic regions, and selects from memory a corresponding channel uniquely assigned to a region containing the current position. The channel is selected by looking up the channel assigned to the geographic region where the radio is located. According to another embodiment, the weather band radio 30 scans for radio wave broadcast messages, receives and deciphers a geographic coverage identifier associated with the message, determines whether that signal channel is assigned to the geographic region of the current GPS position, and automatically tunes to the signal channel that is assigned to that region. It should be appreciated that other geographically defined regions may be employed, such as defining boundaries based on rectilinear coordinates or based on distance from a certain location, such as a county seat, without departing from the teachings of the present invention.

Figure 4:
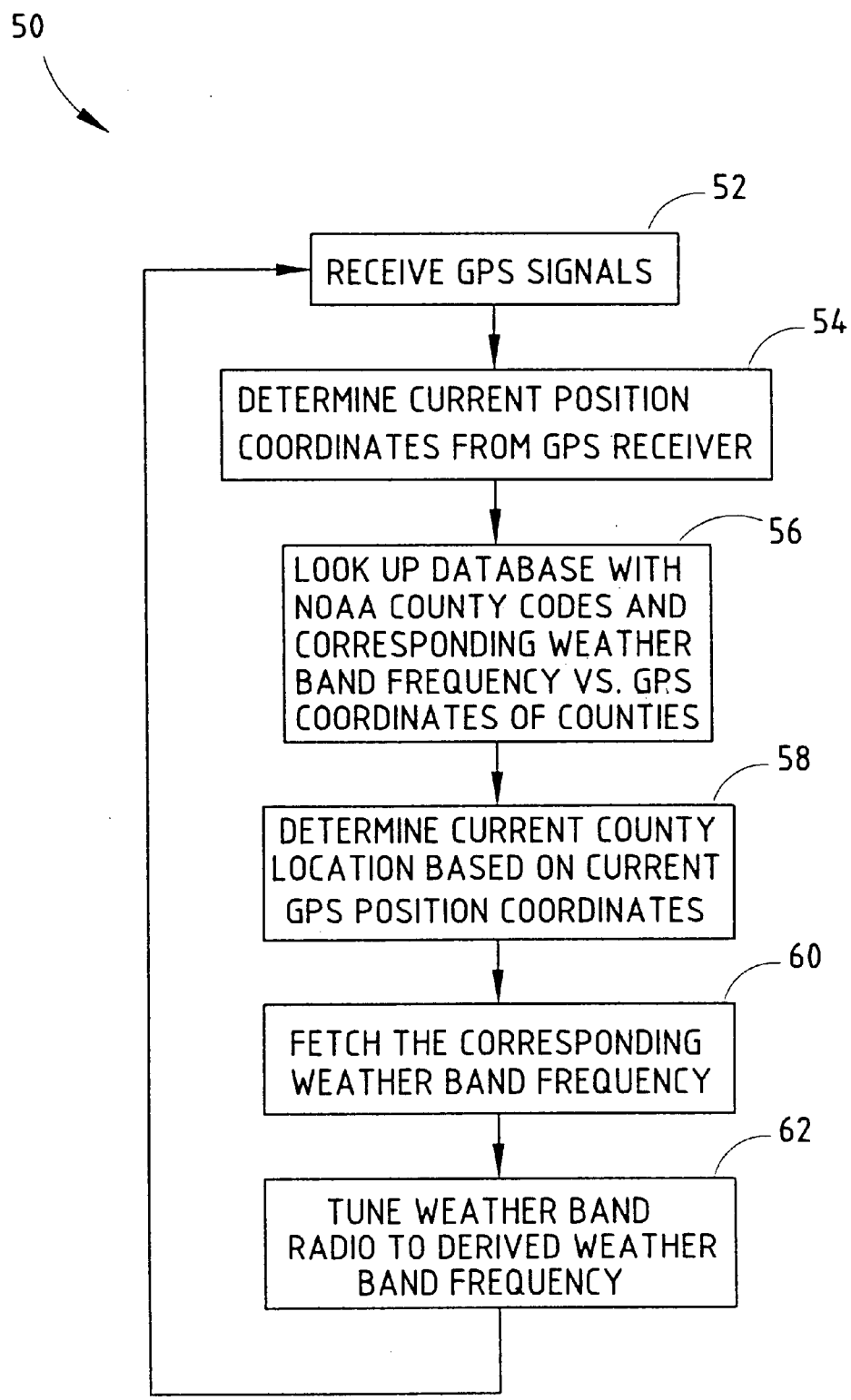
FIG. 4 is a flow diagram illustrating a method of tuning the weather band radio according to one embodiment of the present invention.

Referring to FIG. 4, a methodology 50 is illustrated therein for automatically tuning the weather band radio to a select signal channel based on 25 the current position of the radio according to one embodiment of the present invention. Methodology 50 receives GPS signals with the GPS receiver in step 52. The current position coordinates are determined from the GPS receiver in step 54. In step 56, methodology 50 performs a look-up in the database which contains the NOAA county identification codes and the corresponding weather band frequency versus GPS coordinates of counties. According to this approach, each weather band signal channel has one or more assigned counties defining its intended coverage region. The weather band frequency for each county is stored in memory along with an electronic mapping of its assigned broadcast coverage area.

Proceeding to step 58, methodology 50 determines the current county of interest based on the current GPS position coordinates. In step 60, the corresponding weather band frequency assigned to the determined current county is fetched from memory. The fetched weather band frequency assigned to the current county of interest is then used to tune the weather band radio to the derived weather band signal channel in step 62. Accordingly, the weather band radio is automatically tuned to a local radio wave signal channel as a function of the determined GPS position coordinates by fetching the assigned weather band channel frequency from memory. The weather band radio preferably remains tuned to the assigned radio wave signal channel to receive weather, emergency, and other information broadcast thereon, until the radio enters a new geographic region assigned to another signal channel.

Figure 5:
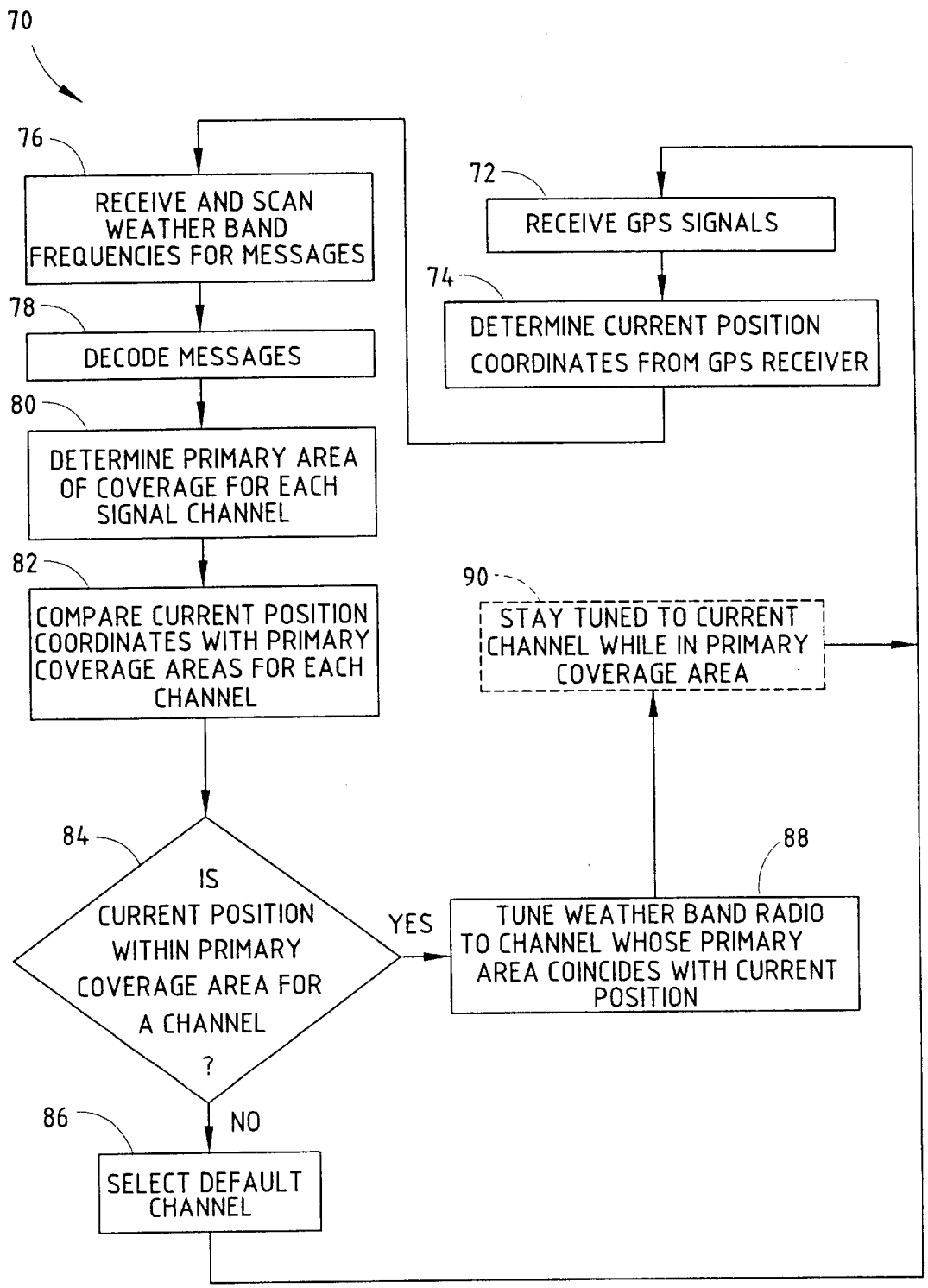
FIG. 5 is a flow diagram illustrating a method of tuning the weather band radio according to another embodiment of the present invention.

With particular reference to FIG. 5, an alternate methodology 70 is shown for automatically tuning the weather band radio to a weather band station based on the location of the radio. Methodology 70 begins at step 72 to receive GPS signals, and then proceeds to determine the current longitude and latitude position coordinates from the GPS receiver in step 74. Next, methodology 70 receives and scans the available weather band frequencies for messages broadcast thereon. The messages received are decoded in step 78, and may include weather, emergency, or other information. Additionally, the decoded messages include one or more primary coverage area identifiers which identify the county, portions of a county, a plurality of counties, or other geographic regions for which the associated weather, emergency, or other message information is assigned to cover.

From the decoded messages, the primary area of coverage for each signal channel is determined in step 80. In step 82, the current GPS position coordinates are compared with the primary coverage areas for each received signal channel. Decision block 84 checks whether the current position is within the primary coverage area for a given signal channel. If the current position is within the coverage area for a given channel, methodology 70 proceeds to step 88 to tune the weather band radio to the signal channel whose primary coverage area coincides with the current position. If the current position is not within the primary coverage area for a given signal channel, methodology 70 selects a default channel, which may include the strongest received signal or last known signal channel, and then returns to step 72. Once the weather band radio has been tuned to a signal channel whose primary coverage area coincides with the current position, methodology 70 may return to step 72 or, alternately, proceed to optional step 90 to stay tuned to the current channel while in the primary coverage area, before returning to step 72. Step 90, in effect, prevents signal channel switching from occurring for as long as the radio remains within the primary coverage area for the tuned signal channel.

Accordingly, the weather band radio 30 of the present invention automatically provides for automatic tuning of the weather band radio 30 to select the signal channel assigned to the current geographic region of interest. In particular, weather band radio 30 selects from memory the signal channel based on the current GPS determined position coordinates. The weather band radio 30 may alternately scan available weather band stations which provide regional broadcast coverage information, and select a signal channel assigned to the current geographic location. This invention advantageously allows a user to receive weather band broadcast information for the current geographic region, thereby avoiding signal channels that are not assigned to the current region of interest.

While the present invention has been described in connection with a weather band radio 30 according to the preferred embodiment, it should be appreciated that the present invention may be applied to other types of radios for receiving various types of information broadcast in various radio band frequencies, without departing from the spirit of the present invention. For example, the tuneable radio may be applied for use in connection with a radio data system (RDS) or a radio broadcast data system (RBDS). As another example, the radio could be used to automatically tune an FM or AM radio.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. A tuneable weather band radio comprising:
   a radio receiver for receiving broadcast radio wave signals including information that pertains to predetermined geographic regions;
   a tuner adjustable for selecting from a plurality of radio wave signal channels within a weather band;
   a device for automatically determining a current position of the radio; and
   a controller for automatically controlling said tuner to select a radio wave signal channel within the weather band based on said determined current position, wherein the selected channel provides information that pertains to a geographic region containing the current position.

2. The radio as defined in claim 1 further comprising memory storing a plurality of selectable signal channels and corresponding geographic regions of coverage assigned to the selectable signal channels, wherein said controller compares said determined current position with said geographic coverage regions to determine which signal channel to select.

3. The radio as defined in claim 2, wherein said memory further comprises geographic identifiers assigned to said geographic coverage regions.

4. The radio as defined in claim 1, wherein said controller determines a coverage region for each of a plurality of said received broadcast signals and selects one of said signal channels when said determined current position is within the coverage region assigned to the selected signal channel.

5. The radio as defined in claim 4, wherein said received broadcast radio wave signals includes a geographic coverage region identifier.

6. The radio as defined in claim 5 further comprising stored geographic coverage region identifiers assigned to said signal channels, wherein said controller selects said one of said signal channels when its stored coverage region identifier matches said received coverage region identifier.

7. The radio as defined in claim 1, wherein said radio is located on a mobile vehicle.

8. The radio as defined in claim 7, wherein said radio is integrated in a car radio.

9. The radio as defined in claim 1, wherein said radio is a portable hand held radio.

10. The radio as defined in claim 1, wherein said device for determining the current position comprises a position indicative receiver for receiving position indicative signals.

11. The radio as defined in claim 10, wherein said position indicative receiver comprises a global positioning system receiver for receiving global positioning system signals.

12. A tuneable weather band radio comprising:
    a radio receiver for receiving broadcast radio wave signals, wherein the broadcast radio wave signals include a geographic coverage region identifier;
    a tuner adjustable for selecting from a plurality of radio wave signal channels within a weather band;
    a device for determining a current position of the radio; and
    a controller for controlling said tuner to select a radio wave signal channel within the weather band based on said determined current position and the geographic coverage region identifier, wherein said controller determines a coverage region for each of a plurality of said received broadcast signals based on the geographic coverage region identifier and selects one of said signal channels when said determined current position is within the coverage region assigned to the selected signal channel.

13. The radio as defined in claim 12 further comprising memory storing a plurality of selectable signal channels and corresponding geographic regions of coverage assigned to the selectable signal channels, wherein said controller compares said determined current position with said geographic coverage regions to determine which signal channel to select.

14. The radio as defined in claim 13, wherein said memory further comprises geographic identifiers assigned to said geographic coverage regions.

15. The radio as defined in claim 12 further comprising stored geographic coverage region identifiers assigned to said signal channels, wherein said controller selects said one of said signal channels when its stored coverage region identifier matches said received coverage region identifier.

16. The radio as defined in claim 12, wherein said radio is employed on a mobile vehicle.

17. The radio as defined in claim 16, wherein said radio is integrated in a car radio.

18. The radio as defined in claim 12, wherein said radio is a portable hand held radio.

19. The radio as defined in claim 18, wherein said position indicative receiver comprises a global position system receiver for receiving global positioning system signals.

20. The radio as defined in claim 12, wherein said device for determining the current position comprises a position indicative receiver for receiving position indicative signals.

21. A method for automatically selecting a signal channel in a weather band radio, said method comprising the steps of:
    receiving broadcast radio wave signals including information that pertains to predetermined geographic regions;
    providing a tuner adjustable for selecting from a plurality of radio wave signal channels within a weather band;
    determining a current position of the radio; and
    automatically controlling said tuner to select a radio wave signal channel within the weather band based on said determined current position, wherein the selected channel provides information that pertains to a geographic region containing the current position.

22. The method as defined in claim 21 further comprising the steps of:
    storing a plurality of selectable signal channels and corresponding geographic regions of coverage assigned to the selectable signal channels; and
    comparing said determined current position with said geographic coverage regions to determine which signal channel to select.

23. The method as defined in claim 21 further comprising the steps of:
    determining a coverage region for each of a plurality of the received broadcast signals; and
    selecting one of said signal channels when the determined current position is within the coverage region assigned to the selected signal channel.

24. The method as defined in claim 23 further comprising the steps of:

decoding said received radio wave signals to determine a geographic coverage region identifier associated therewith;

storing in memory geographic coverage region identifiers assigned to said signal channel; and selecting said radio wave signal channel when its stored coverage region identifier matches the received coverage region identifier.

25. The method as defined in claim 21 further comprising the step of locating said radio on a mobile vehicle capable of traveling in a plurality of geographic regions having different assigned signal channels.

26. The method as defined in claim 25 further comprising the step of integrating said radio in a car radio.

27. The method as defined in claim 21, wherein said step of determining a current position of the radio comprises receiving position indicative signals with a position indicative receiver.

28. The method as defined in claim 27, wherein said step of receiving position indicative signals comprises receiving global position system signals with a global positioning system receiver.

\* \* \* \* \*